United States Patent [19]
Michel et al.

[11] Patent Number: 6,137,124
[45] Date of Patent: *Oct. 24, 2000

[54] INTEGRATED VERTICAL SEMICONDUCTOR COMPONENT

[75] Inventors: Hartmut Michel; Peter Flohrs, both of Reutlingen; Christian Pluntke, Hechingen; Alfred Goerlach, Kusterdingen; Anton Mindl, Hildesheim; Ning Qu, Reutlingen, all of Germany

[73] Assignee: Robert Bosch GmbH, Stuttgart, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/963,447

[22] Filed: Nov. 3, 1997

[30] Foreign Application Priority Data

Nov. 20, 1996 [DE] Germany .................. 196 48 041

[51] Int. Cl.$^7$ .................. H01L 29/772; H01L 29/745; H01L 29/808
[52] U.S. Cl. .................. 257/263; 257/128; 257/140; 257/146; 257/135; 257/273
[58] Field of Search .................. 257/608, 107, 257/135, 146, 140, 128, 110, 120, 263, 273

[56] References Cited

U.S. PATENT DOCUMENTS

| | | | |
|---|---|---|---|
| 3,295,030 | 12/1966 | Allison | 257/263 |
| 4,354,121 | 10/1982 | Terasawa et al. | 307/252 |
| 4,514,747 | 4/1985 | Miyata | 257/263 |
| 4,952,990 | 8/1990 | Grüning | 257/107 |
| 5,086,330 | 2/1992 | Mineto | 257/263 |
| 5,175,598 | 12/1992 | Nishizawa et al. | 257/107 |
| 5,341,003 | 8/1994 | Obinata | 257/135 |
| 5,548,133 | 8/1996 | Kinzer | 257/155 |
| 5,600,160 | 2/1997 | Hvistendahl | 257/107 |

FOREIGN PATENT DOCUMENTS

| | | | |
|---|---|---|---|
| 0 179 099 | 4/1986 | European Pat. Off. . | |
| 002214187 | 9/1973 | Germany | 257/107 |
| 0179099 | 7/1988 | Germany . | |
| 405190839 | 7/1993 | Japan | 257/107 |

*Primary Examiner*—Jerome Jackson, Jr.
*Attorney, Agent, or Firm*—Kenyon & Kenyon

[57] ABSTRACT

A vertical semiconductor component has an integrated switching device, which delivers an electric value correlating with the rear potential. The semiconductor component includes a doping region with a hole, which is free of the doping atoms of the doping region. The hole, when properly sized and contacted, can supply an electric current correlating with the rear potential.

13 Claims, 4 Drawing Sheets

INTEGRATED VERTICAL SEMICONDUCTOR COMPONENT

BACKGROUND INFORMATION

A vertical semiconductor component with an integrated switching means delivering an electric value correlated with the rear potential is described in European Patent No. 0 179 099. However, the switching means is arranged laterally and takes up a considerable portion of the chip surface.

SUMMARY OF THE INVENTION

The integrated vertical semiconductor component according to the present invention has the advantage that it delivers an electric value correlated with the rear potential in a compact, yet constant-voltage and high-resistance arrangement, which electric value can be processed on the front of the chip using logic elements.

Such a vertical arrangement can be implemented in a simple manner by using a vertical current flow.

An upper doping region on the front of the chip with a hole that has the doping of the substrate represents a particularly simple arrangement. This hole makes it possible to achieve a current flow on the front of the chip that correlates with the rear potential.

A certain correlation between the current and the rear potential can be set by suitable selection of the hole diameter. It has been proven to be particularly advantageous if the hole diameter is approximately equal to the penetration depth of the upper (p-) doping region.

The lateral dimension of the hole can be determined by applying an additional highly doped (p-) surface doping region around the hole. If the upper p-doping region is isolated from a logic trough where logic elements are installed, which will be hereinafter referred to as a measuring trough, the potential of the logic trough can be set independently of the potential of the measuring trough.

If the measuring trough is designed as a region isolated from the logic trough, the metal contact of the hole can be designed so that it contacts the measuring trough at the same time. This provides increased voltage stability of the switching means against breakdowns.

If the integrated vertical semiconductor component is a power semiconductor component, the arrangement according to the present invention allows a low-voltage electric value correlating with the high rear potential to be delivered to integrated logic elements. In particular, if the power semiconductor component is designed as an intelligent power semiconductor switch, the arrangement according to the present invention can be advantageously used for current limitation, overload protection, and the like.

DETAILED DESCRIPTION

Figure 1:
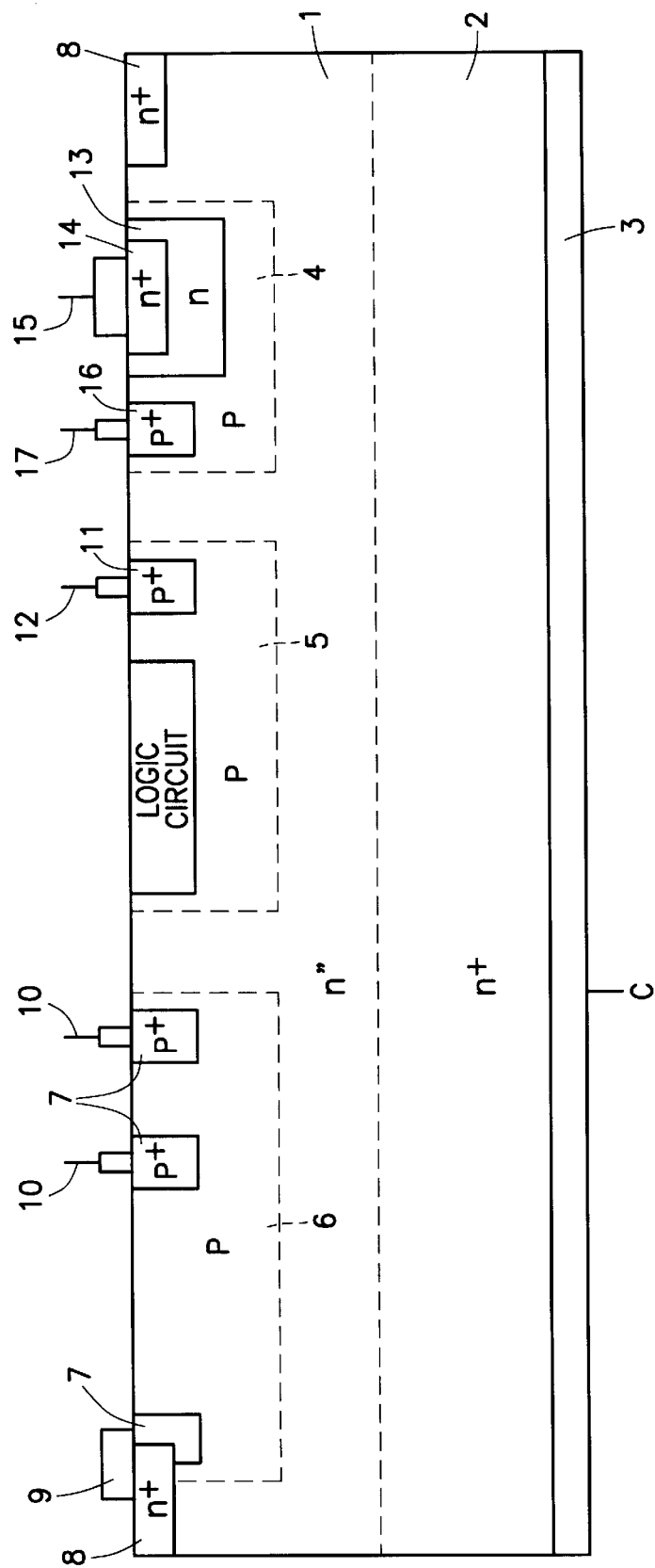
FIG. 1 shows a vertical semiconductor component according to the related art with a large-surface laterally arranged voltage divider.

FIG. 1 schematically shows a vertical semiconductor component of the related art, represented by a transistor. A metal contact 3 representing collector terminal C is mounted in the n-doped substrate on the highly n-doped rear 2. Three p-doped troughs 4, 5, 6 are embedded on the slightly doped front 1 of the semiconductor component of FIG. 1.

An n-doped emitter region 13 is embedded in trough 4 serving as a transistor base. The emitter region is connected to emitter terminal 15 and the transistor base is connected to base terminal 17 via similarly highly doped taps 14 and 16, respectively. Trough 5, hereinafter referred to as a logic trough, is also connected to logic trough terminal 12 via a highly doped logic trough tap 11. All three troughs are isolated from one another by slightly doped n regions, as is trough 6, hereinafter referred to as the voltage divider, which has three highly p-doped taps 7, with two taps being connected to voltage divider terminals 10. Out of the three taps 7, the edge tap is electrically connected to a highly n-doped edge region 8 (channel stop) via a metal jumper 9.

FIG. 1 shows a vertical semiconductor component with a vertically arranged transistor with emitter region 13, transistor base 4, and slightly n-doped front 1, serving as a collector. Logic trough 5, where additional functions can be integrated in the semiconductor component, such as current limitation, temperature switch-off, and the like, is laterally isolated from transistor base 4. These functions are not illustrated; only logic trough tap 11 is shown, through which the potential of the logic trough is held at a certain level. For example, if one of the functions integrated in the logic trough needs information on the rear potential at contact C, the related art may provide a component with a lateral voltage divider to achieve this object. For this purpose, the rear potential is conducted to the voltage divider via the highly n-doped channel stop 8 and the edge tap out of taps 7 of voltage divider 6, electrically connected to channel stop 8 via metal jumper 9. Depending on the arrangement of the additional taps 7, a certain voltage correlated with rear voltage $U_C$ can be tapped. The resistance of this voltage divider must be high and it must ensure a constant voltage. Therefore, its integration is surface-intensive. The middle one of taps 7 is electrically connected to a corresponding contact of a logic element (not illustrated) in logic trough 5. This electrical connection is also not illustrated. A reduced rear voltage is supplied to the logic element in the logic trough through this connection. This low voltage can be analyzed using low-blocking signal transistors in logic trough 5. The disadvantage of this arrangement is that a large silicon surface is required by the high-resistance high-blocking voltage divider. The embodiments according to the present invention described in the following figures eliminate this disadvantage.

Figure 2:
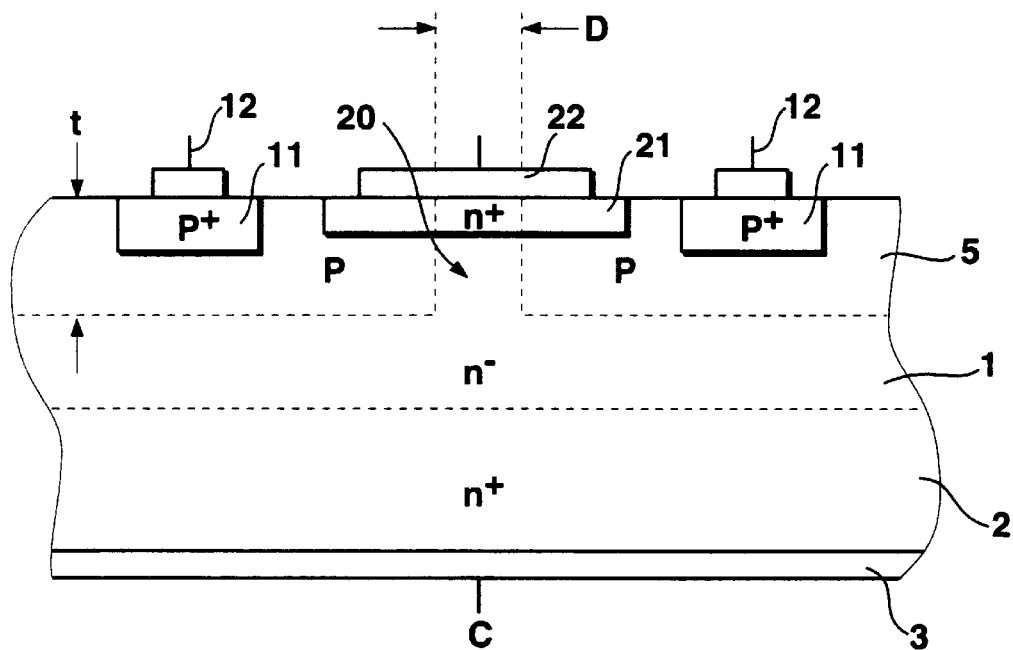
FIG. 2 shows a first embodiment of the semiconductor component according to the present invention.

FIG. 2 shows a section of an embodiment of the semiconductor component according to the present invention. There is a hole 20, having the weak n-doping of front 1, in logic trough 5. This hole 20 can be electrically contacted via a hole tap 21, formed by a highly n-doped region extending into the p-doped region of logic trough 5, and can be contacted via hole metal contact 22. Hole 20 has a diameter D. This diameter D is preferably of the same size as penetration depth t of logic trough 5. In a preferred embodiment, the logic trough can be contacted via a logic trough tap 11 and logic trough terminal 12 symmetrically around hole 20. Logic trough 5 is in general set to ground potential.

Hole tap 21, formed by the highly n-doped region, can also be designed so that it does not extend into the p-doped region of logic trough 5. The hole metal contact 22 is then made smaller so that it contacts only the highly n-doped region 21.

If potential $U_C$ is present at rear contact C, a current can flow from the rear to hole metal contact 22 on the front. Let us assume that $U_C$ is positive and greater than the potential at hole metal contact 22. If voltage $U_C$ increases, the space charge region of the pn junction between logic trough 5 and front 1, located in the non-conducting direction, expands and prevents the current from flowing from contact C to hole metal contact 22. Thus the current flowing through hole metal contact 22 increases with an increasing rear voltage $U_c$ at a decreasing rate, until the increase becomes approximately linear.

Figure 3:
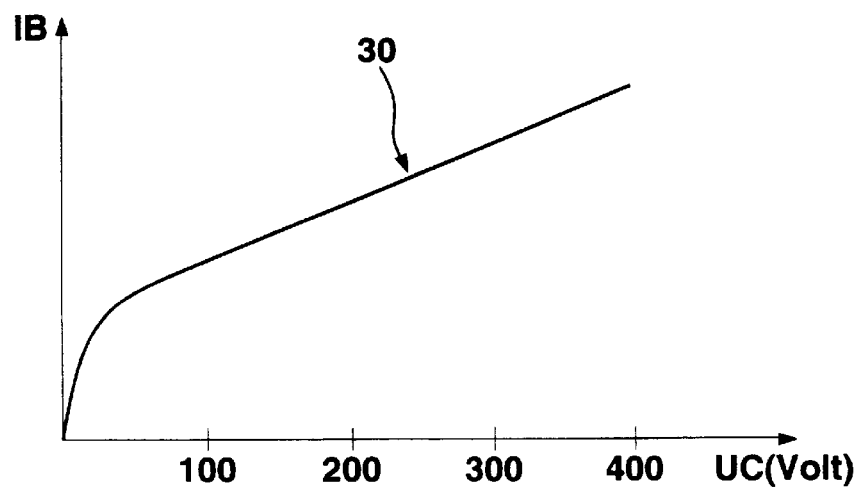
FIG. 3 shows a current-voltage characteristic of the semiconductor component according to the present invention.

This characteristic of the current flowing through hole 20 is shown in FIG. 3 for the case when the potential of hole metal contact 22 is equal to zero. In the diagram, current $I_B$ flowing through hole 20 is plotted against rear voltage $U_C$. According to this diagram, hole current $I_B$ is linked to the rear voltage and can therefore be analyzed by a suitable logic circuit integrated in logic trough 5. The current can then be set through a suitable selection of opening diameter D of hole 20. A diameter D on the order of magnitude of penetration depth t has shown to be particularly advantageous. If hole diameter D is selected to be considerably smaller, the current flow through hole 20 is soon blocked as rear voltage $U_C$ increases, due to the expanding space charge region, so that the current, which could be used as a measure of rear voltage $U_C$, stops flowing through metal contact 22. On the other hand, if hole diameter D were selected to be considerably larger, a linear relationship would exist between the current flow through hole 20 and rear voltage $U_C$.

This would result in unmanageably high currents for high rear voltages $U_C$.

The blocking state currents, particularly arising at high temperatures, of the pn junction between logic trough 5 and front 1, have virtually no affect on the current flowing through hole metal contact 22, since it runs off directly to logic trough terminal 12, which is grounded. The maximum possible voltage between logic trough terminal 12 and hole metal contact 22 is determined by the avalanche breakdown voltage of the pn junction between hole tap 21 and logic trough 5. If this avalanche breakdown voltage is insufficient, an arrangement according to FIG. 5 can be selected.

The relationship between hole current $I_B$ and rear voltage $U_C$ has a linear portion 30, which allows rear voltage $U_C$ to be detected in an ideal manner. In addition to diameter D of hole 20, the current-voltage characteristic, however, also depends on the potential of hole metal contact 22, which is assumed to be identical to the ground potential in FIG. 3. However, if the potential of hole metal contact 22 is analyzed in a logic circuit, contact 22 is no longer grounded, and the current-voltage curve is somewhat shifted. In the linear portion of the curve of FIG. 3, the current is then approximately equal to its value at voltage $U_C$ less the potential of hole metal contact 22.

Figure 4:
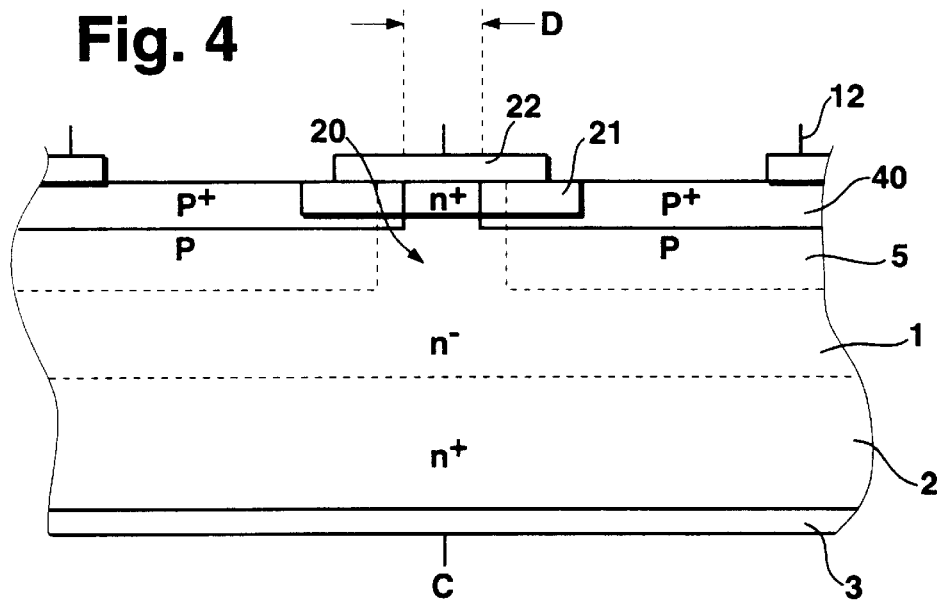
FIG. 4 shows a second embodiment of the arrangement according to the present invention.

FIG. 4 shows another embodiment of the semiconductor component according to the present invention. The relevant section around hole 20 is illustrated. In addition to p-doped logic trough 5, a highly p-doped surface doping region 40 somewhat extending into hole 20 is introduced in the area of logic trough 5. Logic trough tap 11 is no longer needed due to the presence of this surface doping region 40, and logic trough terminal 12 can be directly mounted on surface doping region 40. Logic trough terminal 12 is in general grounded also in this case. Contrary to FIG. 2, hole diameter D is now determined by the diameter of the area left free by surface doping region 40. Surface doping region 40 is flatter than logic trough 5. This allows a more accurate doping profile to be set than for the deeper logic trough 5. Specifically, the geometry of hole 20 can be established more accurately in this way than it could be without the additional surface doping region 40. However, with this arrangement, the blocking capability is reduced, since the maximum voltage applicable between contact C and hole metal contact 22 is given here by the breakdown voltage between hole tap 21 and the highly p-doped surface doping region 40, which is lower than the breakdown voltage between hole tap 21 and p-doped logic trough 5 in FIG. 2. If, for example, we have a blocking voltage of approximately 50 V between hole metal contact 22 and rear metal contact 3 in FIG. 2, this value is reduced to approximately 10 V in an arrangement according to FIG. 4. An arrangement according to FIG. 5 again eliminates this disadvantage.

Figure 5:
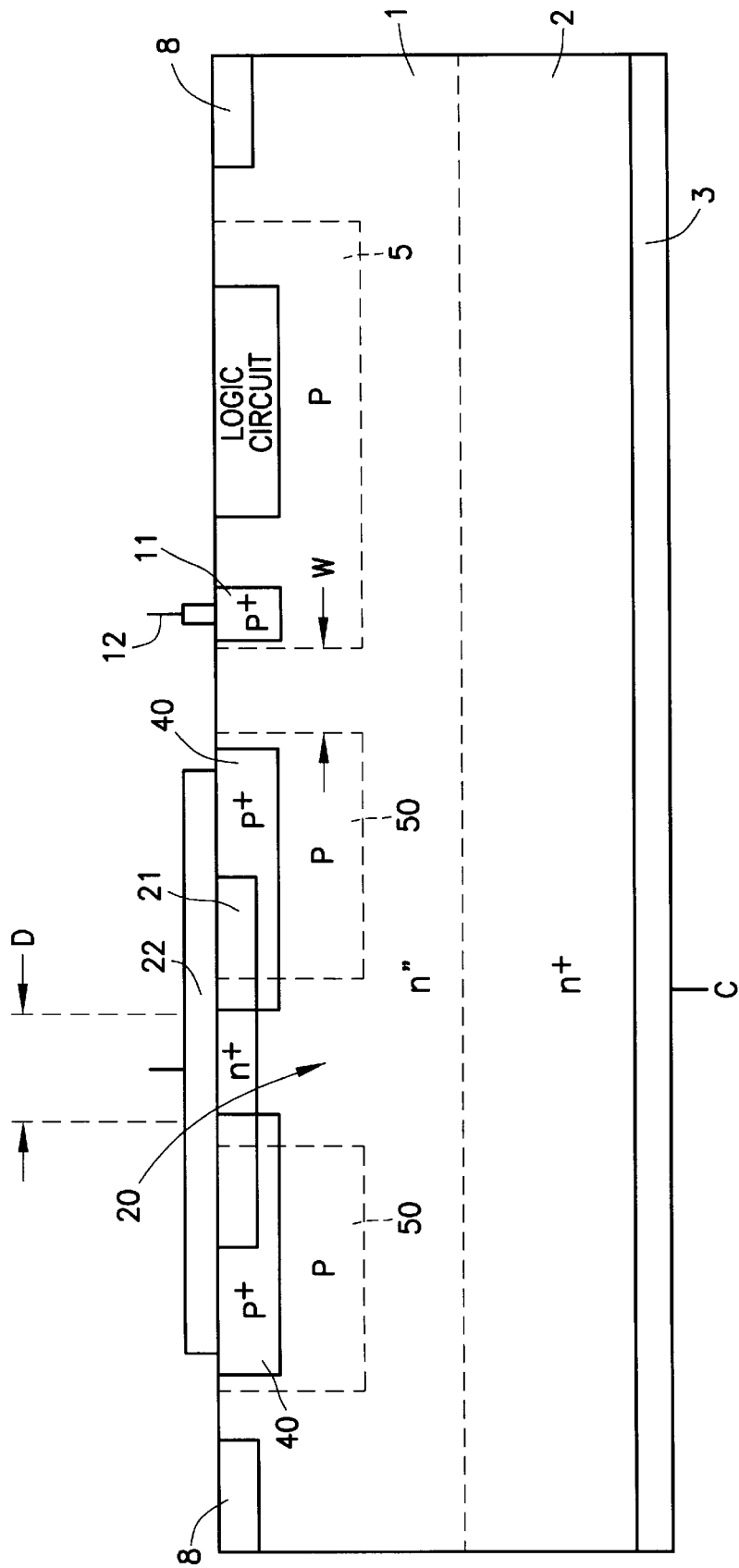
FIG. 5 shows a third embodiment of the arrangement according to the present invention.

FIG. 5 shows another embodiment, which is a variant of that of FIG. 4. Contrary to FIG. 4, hole 20 is not integrated in logic trough 5, but the arrangement according to FIG. 5 has a measuring trough 50, which is produced in the same manufacturing step as logic trough 5. It is also p-doped, like logic trough 5, and is separated from logic trough 5 and transistor base 4 by at least a distance W. Distance W is between approximately 80 $\mu$m and 200 $\mu$m.

The distance must always be selected so that no breakdown occurs. Since the logic trough can be contacted separated from the measuring trough via logic trough terminal 12, it is possible in this arrangement to contact hole tap 21 together with surface doping region 40. This offers the advantage of increased voltage stability of the arrangement according to the present invention, since the breakdown voltage is no longer determined by the avalanche breakdown voltage as it was in the previously described embodiments. Therefore, voltages higher than 50 V can be applied between hole tap 21 and ground terminal 12.

An arrangement according to FIG. 2 can also be arranged in a separate measuring trough like the embodiment of FIG. 5 with the same advantages mentioned above.

If the arrangement according to the present invention with hole 20 is used as an insulated component or, in the case of a combination with transistors or other components, no insulation of these components is needed, the measuring trough can also be omitted. Alternatively, if the arrangement with hole 20 does not need to have a high blocking capacity, additional separate metal contacts can be provided for hole tap 21 and surface doping region 40 also in the arrangement illustrated in FIG. 5 with its own measuring trough 50.

Figure 6:
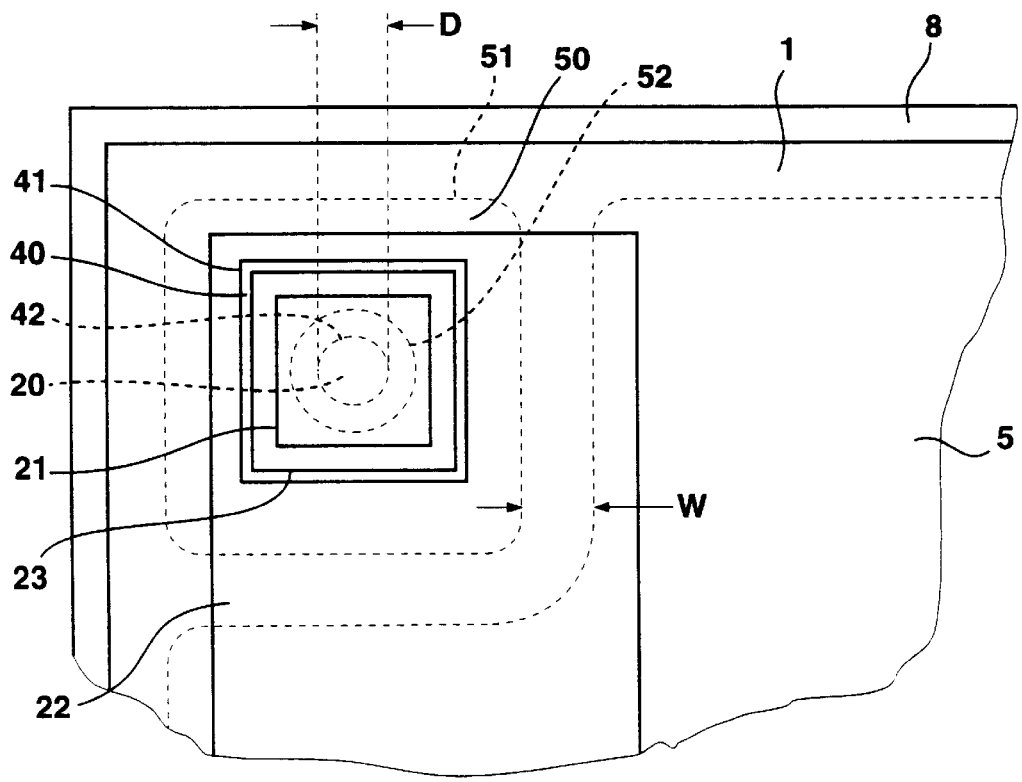
FIG. 6 shows a fourth embodiment of the arrangement according to the present invention.

FIG. 6 shows the top view of an embodiment according to FIG. 5. The reference numbers used in the previously described embodiments will not be described again. Outer edge 51 and inner edge 52 of measuring trough 50 are shown as dashed lines. The measuring trough is separated from logic trough 5 by a distance W. Any logic elements that may be installed in logic trough 5, transistor base 4, and the like are not illustrated. In the top view, channel stop 8 located in front 1 and running along the edge of the semiconductor component can be seen in the top view. The junction between channel stop 8 and front 1 can also be covered with a narrow peripheral metal strip at potential $U_C$, which is not shown in FIG. 6.

The geometry of hole 20 with diameter D is determined by inner edge 42 of surface doping region 40. The outer edge of surface doping region 40 is denoted as 41. Hole metal contact 22 has a large surface. The hole metal contact is delimited by line 23. Hole metal contact 22 is electrically connected to the semiconductor component underneath only within this hole metal contact limit 23. Outside the region delimited by line 23, it is electrically insulated by an insulating layer (not illustrated) from measuring trough 50, front 1, and logic trough 5. Hole metal contact 22 contacts only hole tap 21 and a portion of surface doping region 40. Thus, prior to applying large-surface metal contact 22, the regions that should not be contacted according to these embodiments must be covered with an oxide layer.

This top view clearly shows that the surface needed for the arrangement with hole 20 is considerably less compared with an arrangement according to the background art. The arrangement illustrated in FIG. 6 with hole 20 at one corner is only one possible, preferred embodiment. Other arrangements of measuring trough 50, for example, in the middle of the semiconductor component, are also possible. The specific choice depends exclusively on the circuit environment where the arrangement according to the present invention is to be used; other geometries (e.g., circular design of the measuring trough) can also be selected.

What is claimed is:

1. An integrated vertical semiconductor component provided on an n-substrate, comprising:

a front side facing a first direction;

a rear side facing a second direction that is opposite to the first direction;

a rear-side connection arranged on the rear side;

at least one element including a semiconductor switch and providing a current flowing from the rear side to the front side; and an integrated measuring element for providing a measured electric potential corresponding to the current, wherein:

the integrated measuring element includes an upper p-doped region introduced into the n-substrate on the front side, the upper p-doped region completely and laterally surrounds a region corresponding to a hole, the hole exhibits a doping of the n-substrate and is connected in one piece to the n-substrate without the hole being separated from the n-substrate by any areas exhibiting a doping different than that of the hole, the hole is contacted via a highly n-doped junction region by a metal contact so that the measured current is capable of being tapped off at the metal contact, the highly n-doped junction region being arranged directly in an area of the hole, and a diameter of the hole is approximately equal to a penetration depth of the upper p-doped region.

2. The component according to claim 1, wherein the upper p-doped region includes a p-measuring trough laterally isolated from a logic trough with installed logic elements.

3. The component according to claim 2, wherein the metal contact contacts the p-measuring trough.

4. The component according to claim 1, wherein the semiconductor switch is a power semiconductor switch.

5. An integrated vertical semiconductor component provided on an n-substrate, comprising:

a front side facing a first direction;

a rear side facing a second direction that is opposite to the first direction;

a rear-side connection arranged on the rear side;

at least one element including a semiconductor switch and providing a current flowing from the rear side to the front side; and an integrated measuring element for providing a measured electric potential corresponding to the current, wherein:

the integrated measuring element includes an upper p-doped region introduced into the n-substrate on the front side, the upper p-doped region completely and laterally surrounds a region corresponding to a hole and has a penetration depth, the hole exhibits a doping of the n-substrate and is connected in one piece to the n-substrate without the hole being separated from the n-substrate by any areas exhibiting a doping different than that of the hole, the hole is contacted via a highly n-doped junction region by a metal contact so that the measured current is capable of being tapped off at the metal contact, the highly n-doped junction region being arranged directly in an area of the hole, the upper p-doped region around the hole has a highly doped p-surface doping region, which has another penetration depth that is less than the penetration depth of the upper p-doped region and which determines a lateral dimension of the hole, and the lateral dimension of the hole is approximately equal to the penetration depth of the upper p-doped region.

6. The component according to claim 1, wherein the highly n-doped junction region does not extend into the upper p-doped region of a logic trough and the metal contact only contacts the highly n-doped junction region.

7. The component according to claim 1, wherein the hole exhibits a weak n-doping of the n-substrate.

8. The component according to claim 1, wherein the measured current increases with an increasing rear voltage at a decreasing rate until the increase becomes approximately linear.

9. The component according to claim 5, wherein the highly n-doped junction region does not extend into the upper p-doped region of a logic trough and the metal contact only contacts the highly n-doped junction region.

10. The component according to claim 5, wherein the hole exhibits a weak n-doping of the n-substrate.

11. The component according to claim 5, wherein the hole is in a measuring trough, the measuring trough being p-doped and being separated from the logic trough and the n-substrate.

12. The component according to claim 10, wherein the measuring trough is separated from the logic trough by a distance that is between approximately 80 $\mu$m and 200 $\mu$m.

13. The component according to claim 5, wherein:

the upper p-doped region is a p-measuring trough laterally isolated from a logic trough having at least one logic element; and the metal contact contacts the p-measuring trough.

* * * * *